(12) United States Patent
Levine

(10) Patent No.: US 9,988,740 B1
(45) Date of Patent: Jun. 5, 2018

(54) SHAPED INDUCTION FIELD CRYSTAL PRINTER

(71) Applicant: NORTHROP GRUMMAN SYSTEMS CORPORATION, Falls Church, VA (US)

(72) Inventor: Darren V. Levine, Acton, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 6 days.

(21) Appl. No.: 15/238,611

(22) Filed: Aug. 16, 2016

(51) Int. Cl.
*C30B 30/04* (2006.01)
*C30B 15/22* (2006.01)
*C30B 35/00* (2006.01)

(52) U.S. Cl.
CPC ............ *C30B 30/04* (2013.01); *C30B 15/22* (2013.01); *C30B 35/00* (2013.01)

(58) Field of Classification Search
CPC combination set(s) only.
See application file for complete search history.

(56) References Cited

U.S. PATENT DOCUMENTS

| | | | |
|---|---|---|---|
| 3,694,165 A * | 9/1972 | Kramer | C30B 15/14 117/217 |
| 3,980,438 A * | 9/1976 | Castonguay | C30B 15/22 117/202 |
| 4,417,944 A * | 11/1983 | Jewett | C30B 15/06 117/212 |
| 5,090,022 A * | 2/1992 | Mortimer | F27B 14/063 373/144 |
| 5,349,921 A | 9/1994 | Barraclough et al. | |
| 5,925,185 A | 7/1999 | Kawashima et al. | |
| 6,001,170 A * | 12/1999 | Tomzig | C30B 15/305 117/208 |
| 6,423,285 B1 | 7/2002 | Itoi et al. | |

(Continued)

FOREIGN PATENT DOCUMENTS

| | | |
|---|---|---|
| CN | 201495106 U | 6/2010 |
| CN | 102990027 A | 3/2013 |

(Continued)

OTHER PUBLICATIONS

Liu, Lijun et al. "3D Global Analysis of CZ-Si Growth in a Transverse Magnetic Field with Various Crystal Growth Rates" Journal of Crystal Growth, 275, 2005 pp. e1521-e1526.

(Continued)

*Primary Examiner* — Erin F Bergner
(74) *Attorney, Agent, or Firm* — John A. Miller; Shumaker, Loop & Kendrick, LLP

(57) ABSTRACT

A crystal printer for fabricating a crystalline part, where the printer includes a crucible for holding a magnetic material that will be fabricated into the part. The printed also includes a heat sink being operable to cool the crucible and a plurality of shaped induction field generators disposed around the crucible and being operable to generate time-varying shaped magnetic fields. A controller controls the plurality of induction field generators so as to generate the time-varying shaped magnetic fields in a manner so that the magnetic fields interact with the material to heat selective areas within the material so that unheated areas in the material are cooled by the heat sink to harden the part into a desired crystalline orientation.

18 Claims, 1 Drawing Sheet

(56) References Cited

U.S. PATENT DOCUMENTS

| | | |
|---|---|---|
| 6,626,993 B2 | 9/2003 | Meier et al. |
| 7,611,580 B2 | 11/2009 | Lu |
| 7,780,783 B2 | 8/2010 | Fukatsu et al. |
| 9,039,835 B2 | 5/2015 | Beringov et al. |
| 2003/0177975 A1 | 9/2003 | Ikesue et al. |
| 2004/0200408 A1* | 10/2004 | Wang .................. C30B 15/02 117/208 |
| 2006/0144321 A1* | 7/2006 | Lu ...................... C30B 15/203 117/30 |
| 2010/0101485 A1 | 4/2010 | Fu et al. |
| 2011/0259262 A1 | 10/2011 | Khattak et al. |
| 2012/0297580 A1* | 11/2012 | Dughiero ............ B22D 27/045 23/295 R |

FOREIGN PATENT DOCUMENTS

| | | |
|---|---|---|
| EP | 0 843 028 A1 | 5/1998 |
| GB | 2 234 193 A | 1/1991 |

OTHER PUBLICATIONS

Li, B. Q. "Solidification Processing of Materials in Magnetic Fields" a component of the Feb. 1998, vol. 50. No. 2, JOM presented as JOM-e, web site http://www.tms.org/pubs/journals/JOM/9802/Li/Li-9802.html,, 9 pgs.

Gell, M. et al. "The Development of Single Crystal Superalloy Turbine Blades" Superalloys, 1980, pp. 205-214.

Dulikravich, George S. et al. "Three-Dimensional Control of Crystal Growth Using Magnetic Fields" SPIE vol. 1916, pp. 65-75.

\* cited by examiner

SHAPED INDUCTION FIELD CRYSTAL PRINTER

BACKGROUND

Field

This invention relates generally to a system and method for fabricating crystalline parts using shaped induction fields and, more particularly, to a crystal printer that inductively melts a metal alloy and then selectively cools the metal alloy using shaped induction fields and a heat sink to provide a shaped crystalline metal alloy part.

Discussion

It is known in the art that crystalline metal alloy parts offer a number of advantages such as strength, integrity, corrosion resistance, etc. For example, by making jet engine turbine blades out of a suitable crystalline metal alloy, the blades will have the desired strength, corrosion resistance, etc. of the alloy and will be able to withstand high temperatures than if the metal alloy was non-crystalline. Many techniques are known in the art for fabricating crystalline metal alloy parts, where at least some of these techniques can be extended to fabricating crystalline semiconductor parts. These fabrication techniques require that the metal alloy be a magnetic ferrite metal alloy, where specific examples include alloys of titanium, nickel and iron, possibly including doping impurities, such as carbon.

One technique for fabricating crystalline semiconductor and metal alloy parts employs an extrusion process, generally known as the Czochralski process, where a seed crystal of the metal alloy is placed in a container of liquid metal alloy and the seed crystal is slowly pulled from the liquid metal alloy as the metal alloy grows around the seed crystal in a crystalline structure matching the seed crystal, where the metal alloy cools as it is withdrawn creating a cylindrical ingot of the crystalline metal alloy. The specific part being manufactured is then machined from the ingot to the shape desired.

Extrusion processes of this type can also be extended to forming the crystalline metal alloy part in a mold having the shape of the part, where the metal alloy is slowly cooled to provide the crystalline structure. More particularly, the liquid metal alloy is placed in a suitable mold where different areas of the mold can be selectively cooled by removing heat from those areas to grow the crystal. For example, by providing the particular metal alloy in the mold, heating the mold so that the liquid alloy melts, and then selectively cooling the mold, the metal will cool in a crystalline format and in the areas where the heat is removed.

The known techniques for fabricating crystalline metal alloy parts are limited in their ability to provide specific crystalline orientations and shapes within the part during the fabrication process. For example, the known techniques can only fabricate the part to the shape of the specific mold being employed, and cannot provide different crystalline orientations inside of the part as it is being fabricated, where one section of the part may have a crystalline growth structure in one direction and another section of the part may have a crystalline growth in a different direction. Thus, the resulting part may have the desired strength in a certain direction, such as tension along a specific axis, but the part may not have the adequate or desired strength in all directions, or in specific desired directions.

DETAILED DESCRIPTION OF THE EMBODIMENTS

Figure 1:
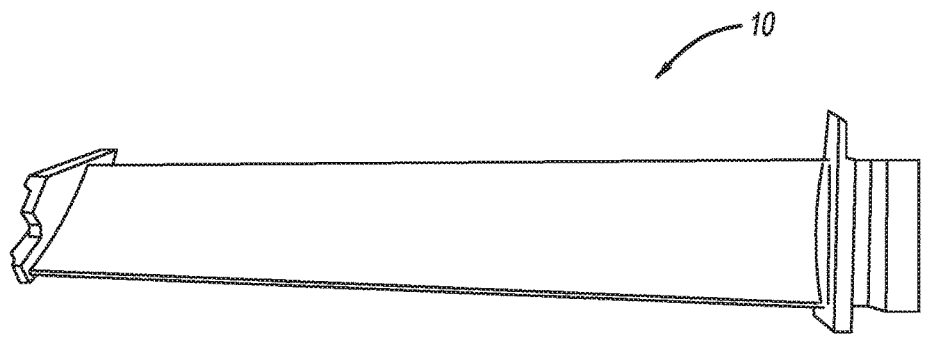
FIG. 1 is an isometric view of a jet engine turbine blade.

The following discussion of the embodiments of the invention directed to a system and method for fabricating crystalline metal alloy parts using shaped induction fields is merely exemplary in nature, and is in no way intended to limit the invention or its applications or uses. For example, the process for fabricating crystalline parts can be extended to other materials, such as silicon and other semiconductor materials.

As will be discussed in detail below, the present invention proposes a system that takes a solid polycrystalline or amorphous material, such as a metal alloy or a semiconductor material, and radiates shaped induction fields through the material to first heat the material above its melting point, and then allow it to cool in a controlled manner to solidify the material into a particular polycrystalline or crystalline shape using precision control of the induction fields. The precision induction field control allows the system to control the growth of the internal crystalline structure of the part by controlling thermal gradients throughout the material during its solidification. Additionally, the system can shape and mold the surface of the material into a desired shape, which is unnecessary to control the crystalline growth, and which can also be done through the implementation of a traditional physical mold. Although the discussion herein refers to the material as being a metal alloy, it is noted that any material that can be strongly influenced by a magnetic field can be fabricated in the manner discussed herein using controlled induction fields, along with some diamagnetic and paramagnetic materials that are also affected by induction.

The system includes three main parts, specifically, one or more time-varying shaped magnetic field generators for generating precision induction fields, a crucible for containing the liquid material, and a heat sink so that heat can escape and the part can cool in a desired manner. The time-varying shaped magnetic field generator creates focused high intensity current-direction-oscillating magnetizing standing fields, which when encountering the material will induce a similar oscillating current at a focused spot in the material through induction. The magnetic field generator can be one of many different types of existing or future digitally controlled phased coils, pulsed magnetic arrays, etc., and types of magnetic field generators where the only requirement is that it would be able to create a magnetic field whose three dimensional current direction and filed magnitudes, i.e., shape, varies in time. The focus point of the induction fields is able to dampen or promote movement, depending on the current oscillation duty cycle and direction, and transmits heat to the material at the focal point, which is created by the interacting combination of the fields, in order to accomplish the functions of the system. In this manner, heat can be transmitted at specific magnitudes to specific X, Y and Z coordinate points in the volume of the material. Because of this three-dimensional heat gradients can be formed throughout the volume of the material in a sustained manner and varying through time. These heat gradients can be used to fully liquefy the material from its original untreated solid polycrystalline state or to prevent cooling of certain portions of the material volume.

A path to the heat sink can be defined in the thermal gradients allowing heat to escape through areas not heated by induction in the material to cool along that path. The heat sink is an area where heat is released and may simply be ambient air on the material surface or a ceramic cold plate. Further, in this manner, a magnetic casting boundary can be created in place of a traditional physical casting volume, thus allowing the secondary function of the system as a surface shaping and molding system. The boundary is created by the fact that induction has a tendency to dampen movement in the direction of the magnetic field lines and can levitate large pieces of material through this strong magnetic force. By precision control of the magnetic field, the field lines can be moved, which moves the local volume of metal that the field is focused on, thus allowing for control over the shape of the part and suspension in space.

Precision movements of discrete material volumes through the magnetic field control can be used to first shape the surface of the material, and then precision fixation of the surface and structurally significant internal volume points to retain the magnetically molded shape. Once the shaping process is completed and the material is still liquid, then the last remaining goal of the system would be to shape the growth of the crystalline structures that develop in the internal volume as the material transitions to a super-cooled solidified state. This crystal growth control leverages the fact that crystal growth is driven by thermal gradients, the crystal growth process from already super-cooled areas into areas cooling to the super-cooled state, and heat escaping through a path connected to the heat sink of choice.

The desired crystal growth can be accomplished by two different techniques. In a first technique, a small volume of the liquid material is allowed to reach a super-cooled state where crystal dendrites will begin to form haphazardly due to small thermal fluctuations. Once a sufficient amount of time has passed to guarantee the dendrites have formed in a specific small volume of the main material volume, then a single cooling path thermal gradient can be introduced by removing the induction field along some path away from the dendrite allowing it to cool. This guarantees that only one of the dendrite crystals will be able to progress through the cooling path, thus isolating a single crystal, although multiple paths can be set up to isolate multiple crystals if that is desired. Once enough time has passed where it is likely that the single dendrite crystal is occupying the cooling path volume, then the original cooling volume that nucleated into the several dendrites can be reliquefied, thus preventing any other dendrites to escape and grow further. In this state, the entire volume exists in a liquid state except for the single or multiple crystals, and possibly the path that the heat sink that was selectively nucleated at a chosen point in space within the volume. The induction field can then be slowly moved and lowered in magnitude in a logical three-dimensional progression through the volume of the material in order to allow the crystal to grow into the cooled areas of the material that is desired, which eventually forms the completed part.

In a second technique, the same process as discussed above could be used, but where an external seed crystal, or multiple seed crystals, would be introduced into the liquid mass of the material and the crystal would grow from there so that the system would not need to take the time to develop a dendrite of its own through the process described above.

It is noted that because of the interacting and reactive magnetic fields produced within the material, the control of these complex induction fields will need to be constantly compensated to maintain the desired thermal gradients and prevent undesired eddy currents. Also, if the material volume increases, so does the reactive magnetic field interference as the fields must penetrate through larger amounts of material to shape the internal structure of the volume of the material. Increasing the field intensity and focus of the field can compensate for this, however for larger volumes, this may render thermal gradient paths to the heat sink difficult to program into the printing process. This means that the material would take an excessively long time to cool, be prevented from cooling into the final part, or the resolution of control over the material would be limited.

The system described herein can fabricate any material into a crystalline part as long as the material can react to magnetic fields. As an example of a suitable part that can be fabricated by the techniques discussed herein, FIG. 1 is an isometric view of a jet engine turbine blade 10 that illustrates one such part.

Figure 2:
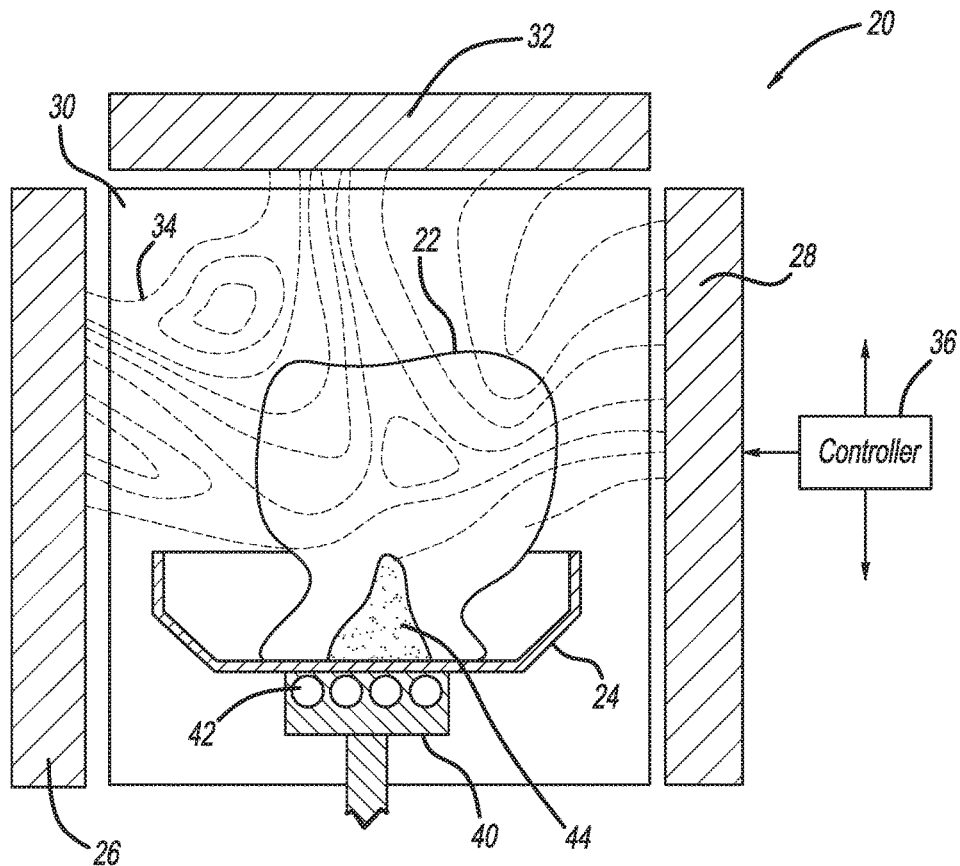
FIG. 2 is an illustration of a crystal printing machine for fabricating a crystalline metal alloy part using shaped induction fields.

FIG. 2 is an illustration of a shaped induction field crystal printing system 20 for producing a shaped part, such as the turbine blade 10, represented generally as part 22, where the part 22 is not shown in its final shape. The part 22 is positioned within a crucible 24, such as a heat resistant ceramic crucible, to hold the part 22 during the shaping and fabrication process as discussed herein. The depiction of the part 22 shown in FIG. 2 is intended to represent the part 22 at any stage during the shaping or molding of the part 22 during the printing process, where the part 22 may be entirely solid, entirely liquid, partially solid, partially liquid, etc.

The printing system 20 includes a plurality of shaped induction field generators provided on all or some of the sides of the part 22. In this non-limiting embodiment, shaped induction field generators 26, 28 and 30 are shown on three sides of the part 22 with the understanding that another shaped induction field generator would be provided in front of the part 22. Further, a shaped induction field generator 32 is provided at a top of the part 22. The induction field generators 26-32 include an array electromagnets that generate magnetic fields depicted by dashed lines 34 that can be selectively controlled by a controller 36 so that strong, weak or no magnetic field lines 34 are provided at a specific location in the part 22. Although the induction field generators 26-32 have the configuration as shown for the system 20, it is stressed that the number of the induction field generators, the size of the induction field generators, the position of the induction field generators, the shape of the induction field generators, etc., are application specific, where the specifics of the induction field generators are selected to provide the desired magnetic field configuration within the part 22. The larger the number of the specific controllable electromagnets in the induction field generators 26-32 determines the resolution and intensity of the magnetic field for a specific location in the part 22.

Once the desired shape and orientation of the magnetic field lines 34 is obtained by controlling the induction field generators 26-32, then the magnetic field lines 34 can be oscillated at all or select locations by alternating the current flow through some or all of the electromagnets in the induction field generators 26-32 to create a time-varying magnetic field that interacts with the material of the part 22 to create heat to melt the part 22 at select or all locations. The time-varying shaped magnetic field causes a complex interaction with the magnetic material in the part 22 that creates current flow in the part 22, which in turn creates other magnetic fields therein. A heat sink 40 is positioned in contact with the crucible 24 and includes, for example, cooling lines 42 through which a suitable cooling fluid can flow at a desired rate, where each of the cooling lines 42 may be controlled independent of each other. By applying cooling to the crucible 24 through the heat sink 40 and heating the part 22 using the magnetic field lines 34, a shaped cooling path 44 can be created within the part 22 so that the crystalline growth process of the part 22 can be selectively controlled.

The system 20 allows variations in the process for generating a shaped crystalline part in the manner discussed herein. In one process, the crucible 24 has the shape of the desired part being fabricated. In this example, a solid piece of the material to be fabricated can be placed in the crucible 24 and the time-varying magnetic fields can be used to melt the material so that it flows into the shape of the crucible 24. The part 22 is then cooled while in the shape of the crucible 24 in a selective and controlled manner as discussed herein, where the magnetic field lines 34 are controlled to maintain a high temperature at some areas in the part 22 and cooling at other areas in the part 22 so that the crystalline growth process occurs in the desired manner.

In another process, the crucible 24 has a general shape, such as rectangular, cylindrical, bowl-shaped, etc., and the part 22 is provided in the crucible 24 in a liquid state, or a solid state where the magnetic field lines 34 would first melt the material into a liquid configuration. In this embodiment, the magnetic field lines 34 are controlled to heat specific areas internal to the part 22, where the heat sink 40 causes the some areas of the part 22 to cool and crystallize so that the part 22 is formed into the specific shape of the crucible 24 and has the desired crystalline orientation, where the part 22 is later machined to the desired shape.

In yet another process, after the material has been provided in a liquid format either by introducing it as such into the crucible 24 or by melting it using the magnetic fields, the shaped magnetic field lines 34 can then be used to mold or shape the liquid material into the desired shape after which it is cooled and hardened. Specifically, by providing the shaped magnetic field lines 34 at the necessary locations, the currents generated in the part 22 create magnetic fields in the part 22 that interact with the magnetic field lines 34 by pushing against each other, where the liquid material in the crucible 24 would be shaped to the desired part while still being in the liquid state. Once the magnetic field lines 34 have set the shape of the part 22 in the liquid state, then the magnetic field lines 34 are shaped and controlled internal to the part 22, where the heat sink 40 allows internal portions of the part 22 to cool and crystallize in the desired orientation. The magnetic field lines 34 are then continually and slowly controlled to allow the part 22 to harden towards the outer surfaces of the part 22 where eventually it will become completely hardened into the desired shape. By producing the part 22 in this manner, a generally shaped crucible 24 can be used to hold a liquid metal alloy that will eventually be shaped in different configurations, saving on molding costs, and also saving on future machining of the part 22.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A crystal printer for fabricating a crystalline part, said printer comprising: a crucible for holding a magnetic material that will be fabricated into the part; a heat sink being operable to cool the crucible; a plurality of shaped induction field generators disposed around the crucible and being operable to generate time-varying shaped magnetic fields, wherein the plurality of shaped induction field generators includes a separate generator on each side of the crucible and a generator above the crucible; and a controller for controlling the plurality of induction field generators so as to generate and control the shape of the time-varying shaped magnetic fields in a manner so that the magnetic fields interact with the magnetic material to heat selective areas within the magnetic material so that unheated areas in the magnetic material are cooled by the heat sink to harden the magnetic material and form the part into a desired crystalline orientation.

2. The crystal printer according to claim 1 wherein the controller controls the magnetic fields so as to shape the magnetic material independent of the shape of the crucible when the magnetic material is in a liquid state, where the magnetic fields are selectively controlled to allow the magnetic material to be internally cooled and harden in the desired shape and crystalline orientation.

3. The crystal printer according to claim 1 wherein the magnetic material is placed in the crucible in a solid format and the magnetic fields are used to melt the magnetic material through inductive heating.

4. The crystal printer according to claim 1 wherein the magnetic material is placed in the crucible in a liquid format.

5. The crystal printer according to claim 1 wherein the crucible has the shape of the part.

6. The crystal printer according to claim 1 wherein the crucible is a ceramic crucible.

7. The crystal printer according to claim 1 wherein the heat sink is a liquid cooled heat sink positioned in contact with the crucible.

8. The crystal printer according to claim 1 wherein the magnetic material is a metal alloy.

9. The crystal printer according to claim 1 wherein the magnetic material is a semiconductor.

10. A crystal printer for fabricating a crystalline metal alloy part, said printer comprising: a crucible for holding a magnetic metal alloy material that will be fabricated into the part; a heat sink being operable to cool the crucible; a plurality of shaped induction field generators disposed around the crucible and being operable to generate time-varying shaped magnetic fields, wherein the plurality of shaped induction field generators includes a separate generator on each side of the crucible and a generator above the crucible; and a controller for controlling the plurality of induction field generators so as to generate the time-varying shaped magnetic fields in a manner so that the magnetic fields interact with the magnetic metal alloy material to heat selective areas within the magnetic metal alloy material so that unheated areas in the magnetic metal alloy material are cooled by the heat sink to harden the part into a desired crystalline orientation, wherein the controller controls the magnetic fields so as to shape the magnetic metal alloy material independent of the shape of the crucible when the magnetic metal alloy material is in a liquid state, where the magnetic fields are selectively controlled to allow the magnetic metal alloy material to be internally cooled and harden in the desired shape and crystalline orientation.

11. The crystal printer according to claim 10 wherein the magnetic metal alloy material is placed in the crucible in a solid format and the magnetic fields are used to melt the magnetic metal alloy material through inductive heating.

12. The crystal printer according to claim 10 wherein the magnetic metal alloy material is placed in the crucible in a liquid format.

13. The crystal printer according to claim 10 wherein the crucible is a ceramic crucible.

14. A method for fabricating a crystalline part, said method comprising: providing the crystal printer of claim 1; placing the magnetic material in the crucible; and operating the controller to control the time-varying shaped magnetic fields in a manner so that the magnetic fields interact with the magnetic material to heat the selective areas within the magnetic material so that the unheated areas in the magnetic material can be cooled to harden the magnetic material and form the part into the desired crystalline orientation.

15. The method according to claim 14 wherein the magnetic fields are controlled so as to shape the material independent of the shape of the crucible when the magnetic material is in a liquid state, where the magnetic fields are selectively controlled to allow the magnetic material to be internally cooled and harden in the desired shape and crystalline orientation.

16. The method according to claim 14 wherein the material is placed in the crucible in a solid format and the magnetic fields are used to melt the magnetic material through inductive heating.

17. The method according to claim 14 wherein the magnetic material is placed in the crucible in a liquid format.

18. The method according to claim 14 wherein the magnetic material is a metal alloy.

* * * * *